United States Patent
Hayase

(10) Patent No.: US 7,317,353 B2
(45) Date of Patent: Jan. 8, 2008

(54) AMPLIFICATION DEVICE

(75) Inventor: Hiromichi Hayase, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 213 days.

(21) Appl. No.: 10/527,220

(22) PCT Filed: Sep. 19, 2003

(86) PCT No.: PCT/JP03/11964

§ 371 (c)(1),
(2), (4) Date: Sep. 27, 2005

(87) PCT Pub. No.: WO2004/030206

PCT Pub. Date: Apr. 8, 2004

(65) Prior Publication Data

US 2006/0091950 A1    May 4, 2006

(30) Foreign Application Priority Data

Sep. 27, 2002    (JP) .............................. 2002-282181

(51) Int. Cl.
*H03F 1/26*    (2006.01)
(52) U.S. Cl. .................... 330/149; 330/107; 375/297
(58) Field of Classification Search ................ 330/149, 330/297, 107; 375/297
See application file for complete search history.

(56) References Cited

U.S. PATENT DOCUMENTS

| 6,175,270 | B1 * | 1/2001 | Vannucci ..................... 330/2 |
| 6,275,103 | B1 | 8/2001 | Maniwa |
| 6,359,508 | B1 * | 3/2002 | Mucenieks .................. 330/149 |
| 6,417,731 | B1 * | 7/2002 | Funada et al. .............. 330/149 |
| 6,614,854 | B1 * | 9/2003 | Chow et al. ................. 375/297 |
| 6,925,106 | B2 * | 8/2005 | Horaguchi et al. ......... 375/146 |
| 7,038,540 | B2 * | 5/2006 | Gurvich et al. ............. 330/151 |

FOREIGN PATENT DOCUMENTS

| EP | 1 229 640 | 8/2002 |
| JP | 10-233629 | 9/1998 |
| JP | 2000-78037 | 3/2000 |
| JP | 2002-176321 | 6/2002 |
| JP | 2002-232325 | 8/2002 |

* cited by examiner

*Primary Examiner*—Patricia Nguyen
(74) *Attorney, Agent, or Firm*—Wenderoth, Lind & Ponack, L.L.P.

(57) ABSTRACT

An amplifier apparatus in which a signal is amplified by an amplifier and distortion produced by the amplifier is compensated for, that can continue to operate even in cases where the amplitude of a distortion component contained in the amplified signal after distortion compensation has become large. Distortion component amplitude detection means 7 and 8 detect the amplitude of distortion components produced by the amplifier 4 that are contained in signals amplified by the amplifier 4 after distortion compensation, and when the amplitude of a detected distortion component exceeds a predetermined threshold value, amplified signal level reduction control means 9 and 1 perform control to reduce the level of the signal amplified by the amplifier 4. In the distortion compensation, the predistortion circuit 3 generates distortion in respect of a signal that has not yet been amplified by the amplifier 4, and based on the detected amplitude of the distortion component, predistortion control means 9 controls the distortion produced by the predistortion circuit 3.

5 Claims, 2 Drawing Sheets

AMPLIFICATION DEVICE

TECHNICAL FIELD

The present invention relates to an amplifier apparatus that compensates for distortion produced by the amplifier when it amplifies a signal, particularly to an amplifier apparatus that can continue to operate even in cases where the amplitude of a distortion component contained in the amplified signal after distortion compensation has become large.

BACKGROUND ART

Predistortion compensation amplifiers (PD compensation amplifiers) are used as high-frequency distortion compensation amplifiers in, for example, base station apparatuses of mobile communication systems and the like to compensate for distortion produced by an amplifier that amplifies signals that are the object of wireless transmission to mobile station apparatuses and the like.

FIG. 4 shows an example of a basic configuration of an adaptive PD distortion compensation amplifier (APD distortion compensation amplifier).

The APD distortion compensation amplifier shown in the drawing comprises a delayer 61, a predistortion circuit 62, amplifier 63 that is the object of the distortion compensation, an envelope detector 64, a memory 65 for storing compensation tables, a sideband power detector 66, an integrator 67 and a controller 68. The predistortion circuit 62 is comprised of a variable attenuator 71 and a phase shifter 72. Stored in the memory 65 as compensation tables are a variable attenuator table 73 and a phase shifter table 74.

An example of the operations carried out by the illustrated APD distortion compensation amplifier will now be described.

Upon a high-frequency input signal being input to the delayer 61, the envelope of the input signal is detected by the envelope detector 64. After the amplitude of the output from the delayer 61 is adjusted by the variable attenuator 71 and the phase is adjusted by the phase shifter 72 in the predistortion circuit 62, it is input to the amplifier 63. In the amplifier 63, the distortion component produced by the predistortion circuit 62 cancels the distortion component produced by the amplifier 63 with respect to the input signal, and the distortion-compensated high-frequency transmission signal is output from the amplifier 63.

The accuracy of the distortion component cancelling is determined by how good the correspondence is between the distortion characteristic of the predistortion circuit 62 and the nonlinearity of the amplifier 63. The correspondence between envelope information on input signals and variable attenuator 71 control modes (compensation data) is stored in the variable attenuator table 73, and the correspondence between envelope information on input signals and phase shifter 72 control modes (compensation data) is stored in the phase shifter table 74. Input signal envelope information obtained by the envelope detector 64 is checked with the variable attenuator table 73 and phase shifter table 74 of memory 65, and the compensation data thus associated with the envelope information as it changes from instant to instant is read out from each of the tables 73 and 74, and the amount of attenuation of the signal amplitude by the variable attenuator 62 and the amount of change in the signal phase (amount of phase shift) by the phase shifter 72 are controlled.

Feedback control is used to improve and optimize the accuracy of the compensation amount. That is, in the power spectrum of the transmission output from the amplifier 63, sideband component power constituting the adjacent channel power is detected by the sideband power detector 66, the detection results are integrated at fixed time periods and the integration results input to the controller 68, and the values stored in the variable attenuator table 73 and the phase shifter table 74 are updated, based on the integration values input to the controller 68. Thereby, optimal compensation data signals are adaptively controlled to be input from the variable attenuator table 73 and phase shifter table 74 to the variable attenuator 71 and phase shifter 72 of the predistortion circuit 62.

With respect to input signal timing, because a delay time arises in the timing of control processing by the predistortion circuit 62 in accordance with envelope information transmission output sideband power information, as described above, before input to the predistortion circuit 62, the delayer 61 delays the input signal by an amount of time that is the same as the delay time required for the control processing.

An example of a conventional technology relating to a distortion detector that detects distortion produced by an amplifier will now be described.

The prior art includes a distortion detector (hereinafter referred to as distortion detector A) that, when the amplifier amplifies a plurality of fundamental waves, uses a narrow band filter to detect third order intermodulation distortion. With the distortion detector A, it is difficult to detect third order intermodulation distortion using a filter when, for example, the frequency of the plurality of fundamental waves is not fixed (see, for example, Patent Reference 1).

The prior art also includes a distortion detector (hereinafter referred to as distortion detector B) that, when a digital modulated wave is amplified by a main amplifier, a filter connected in parallel to the output terminal of the main amplifier is used to transmit waves that are multiples of the signal frequency, the transmitted signals are amplified and a wave detector is used to detect the amplified signals and convert them into direct-current voltage signals corresponding to the input level, detects the Adjacent Channel Power (ACP) produced by the nonlinearity of the main amplifier on the basis of the direct-current voltage signals (see, for example, Patent Reference 1).

Here, the distortion detector B is detecting the ACP as the distortion component produced by the amplifier. It is suitable for ACP detection since, compared to a double wave, the amount of power change in a distorted triple wave is large. As one example, the filter of the distortion detector B was made to transmit a double wave or triple wave (see, for example, Patent Reference 1).

Patent Reference 1

Unexamined Japanese Patent Publication 2000-286644

However, with a prior art PD distortion compensation amplifier such as, for example, the one shown in FIG. 4, if the distortion component should greatly increase due to an anomaly in the amplifier 63, it becomes impossible for the distortion component generated by the predistortion circuit 62 to cancel the distortion component produced by the amplifier 63. When this situation arises, it is necessary to expeditiously stop transmission, since the distorted output becomes spurious and interferes with other radio waves. However, then there is the problem that when transmission is stopped, the PD distortion compensation amplifier is unable to operate.

The present invention was accomplished to resolve such problems in the prior art, and has as its object to provide an amplifier apparatus that, when compensating for distortion produced by an amplifier in the course of amplifying a signal, can continue to operate even when, for example, the amplitude of the distortion component contained in the amplified signal after distortion compensation becomes large.

DISCLOSURE OF THE INVENTION

To attain the above object, when compensating for distortion produced by an amplifier when amplifying a signal, the amplifier apparatus of the present invention performs the following processing.

That is, a distortion component amplitude detection means detects the amplitude of a distortion component produced by an amplifier in a signal that has been amplified by the amplifier following distortion compensation. Then, if the amplitude of the distortion component detected by the distortion component amplitude detection exceeds a predetermined threshold value, an amplified signal level reduction control means performs control to reduce the level of the signal amplified by the amplifier.

Therefore, even if, for example, the amplitude of the distortion component of the amplified signal following distortion compensation becomes large, control is carried out to reduce the level of the signal amplified by the amplifier, enabling the amplifier apparatus to continue to operate. As an example, in the case of the amplification of a signal that is an object of wireless transmission, it is possible to prevent a distorted output becoming spurious and interfering with other radio waves, thereby enabling signal transmission to continue.

Normally, an operator will do his utmost to not switch off the power supply of an amplifier apparatus in operation, stopping the amplifier apparatus. In the case of the amplifier according to the present invention, it is possible to prevent this, and for operation to continue by decreasing the output, even if the amplitude of the distortion component of the amplified signal following distortion compensation becomes large.

Various signals may be used as the amplification object signal, such as, for example, signals and the like that are the object of wireless transmission.

Also, various amplifiers may be used. For example, an amplifier may be used that consists of one amplifying element, or a combination of a plurality of amplifying elements.

Also, as the amplifier-produced distortion component contained in a signal amplified by the amplifier following distortion compensation, with respect, for example, to a signal that has also been amplified by an amplifier after having been distortion-compensated, there may be used a distortion component that is contained in the signal and a distortion component produced by the amplifier. That is, such a distortion component would be the component of distortion produced by the amplifier, corresponding to a distortion component that is not completely compensated for by distortion compensation and remains (residual distortion).

Also, the distortion amplitude detection means does not have to detect the amplitudes of all distortion components produced by the amplifier; for example, it may detect the amplitudes of a portion of the distortion produced by the amplifier.

Also, in cases in which the distortion amplitude detection means detects the amplitudes of a portion of the distortion produced by the amplifier, the amplitudes of various components may be detected; for example, a mode can be used whereby the amplitude of a distortion component of a preset frequency is detected. As an example, a mode can be used whereby the amplitude of a frequency component or the amplitude of a frequency component of a triple wave or double wave of the signal (fundamental signal) that an object of amplification by an amplifier is detected is the distortion component amplitude.

Also, various amplitudes may be detected as the distortion component amplitude; for example, the amplitude of a power level or the like may be detected.

As the distortion component amplitude, it is also possible to use, for example, the integrated value of distortion component levels detected in a predetermined period or the average temporal value of distortion component levels detected in a predetermined period. In this case, as the predetermined period, various periods may be used according to, for example, the communication system or the like that is used.

Also, various values may be used as the predetermined threshold value used by the amplified signal level reduction control means. As an example, in a case in which accurate distortion compensation cannot be achieved and distortion that is large enough to give rise to adverse effects such as spuriosities and the like remains in the amplified signal after distortion compensation, the amplitude value of the detected distortion component can be used as the predetermined threshold value; when, in this mode, the distortion remaining in the amplified signal after distortion compensation is large enough to produce said adverse effects, control is performed to reduce the level of distortion contained in the amplified signal after distortion compensation.

Also, while the above description is made with respect to a case in which the amplitude of a distortion component detected by the distortion component amplitude detection means exceeds a predetermined threshold value, a case in which the amplitude of the distortion component is the same as the predetermined threshold value is not particularly limited, and may for example be treated in the same way as an the case in which the predetermined threshold value is exceeded, or by using another mode.

Also, various modes may be used as the mode of control to reduce the level of the signal amplified by the amplifier. For example, there may be used a mode that attenuates the signal before amplification by the amplifier by providing a stage before the amplifier with a variable attenuator or the like that attenuates the signal, or a mode that attenuates the signal after amplification by the amplifier by providing stage after the amplifier with a variable attenuator or the like that attenuates the signal, or a mode that reduces the signal level after amplification by using an amplifier constituted as a variable-gain amplifier and changing the gain of the amplifier.

Also, various degrees may be used as the degree of control by the amplified signal level reduction control means to reduce the level of a signal amplified by the amplifier. For example, a mode may be used that performs a degree of control that can prevent the generation of adverse effects caused by distortion; as an example, a mode may be used in which the amplitude of a distortion component detected by the distortion component amplitude detection means is controlled to be less than a predetermined threshold value (or not more than a predetermined threshold value).

Also, distortion produced by an amplifier is compensated for using the amplifier apparatus according to the present invention comprising the following means as an example configuration. This example configuration corresponds to the adaptive predistortion method.

That is, a predistortion means generates distortion with respect to a signal prior to amplification by an amplifier. And, on the basis of the amplitude of the distortion component detected by a distortion component amplitude detection means, a predistortion control means controls the distortion generated by the predistortion means.

Here, the distortion generated by the predistortion means is, for example, controlled to be distortion that can cancel distortion produced by the amplifier, or close to distortion that can cancel distortion produced by the amplifier; specifically, controlled to be distortion that is the inverse of distortion produced by the amplifier, that is, distortion having the same amplitude as the distortion produced by the amplifier and the opposite phase (that is, the phase is 180 degrees different) or close to such distortion.

Also, the predistortion control means, for example, controls the distortion generated by the predistortion means to reduce the amplitude of the distortion component detected by the distortion component amplitude detection means, and in an example of a preferred mode, the distortion generated by the predistortion means is controlled to minimize the amplitude of the distortion component detected by the distortion component amplitude detection means.

Also, various modes may be used as the mode by which the distortion generated by the predistortion means is controlled by the predistortion control means; for example, a mode may be used in which the distortion amplitude or phase is controlled.

As an example, a mode may be used comprising signal level detection means that detect the level of a signal prior to amplification by an amplifier, and predistortion control mode memory means that stores predistortion means control mode associations with signal levels, and controls the predistortion means using control modes stored in the predistortion control mode memory means corresponding to the signal level detected by the signal level detection means. Also, in this mode, for example, a mode may be used wherein the predistortion control means updates the contents of the predistortion control mode memory means based on the amplitude of the distortion component detected by the distortion component amplitude detection means.

The distortion compensation method performed by the amplifier apparatus is not limited to the predistortion method or adaptive predistortion method, other methods being usable. As an example, the feed forward method (FF method) can be used as the method of distortion compensation, in which case the present invention is applied to, for example, a feed forward distortion compensation amplifier having a distortion detection loop and a distortion compensation loop (distortion removal loop). With a conventional feed forward distortion compensation amplifier, control is effected using a pilot signal. The present invention can also be applied to adaptive predistortion (APD) system or other such distortion compensation amplifiers that process baseband signals (BB signals) or APD or other such distortion compensation amplifiers that process digital signals.

The amplifier apparatus according to the present invention can also be applied to base station apparatuses or relay amplifier apparatuses provided in wireless communication systems such as mobile communication systems.

Here, various systems such as cellular phone systems or Personal Handy phone Systems (PHS) may be used as the wireless communication system.

In addition, various communication protocols may be used as the communication method such as, for example, the Code Division Multiple Access (CDMA) method or Wideband (W)-CDMA) method, the Time Division Multiple Access (TDMA) method, and the Frequency Division Multiple Access (FDMA) method.

BEST MODE FOR CARRYING OUT THE INVENTION

Embodiments of the present invention will now be described with reference to the drawings.

The following embodiment shows a case in which the present invention is applied to an adaptive predistortion distortion compensation amplifier (APD distortion compensation amplifier). Also, the APD distortion compensation amplifier shown in the following embodiment is provided in the base station apparatus of a mobile communication system, and amplifies a signal that is the object of wireless transmission by the base station apparatus that is input. The signal that has been amplified and distortion-compensated by the APD distortion compensation amplifier is wirelessly transmitted by the base station apparatus from an antenna to a mobile station apparatus or the like constituting the communicates.

First, the first embodiment will be described.

Figure 1:
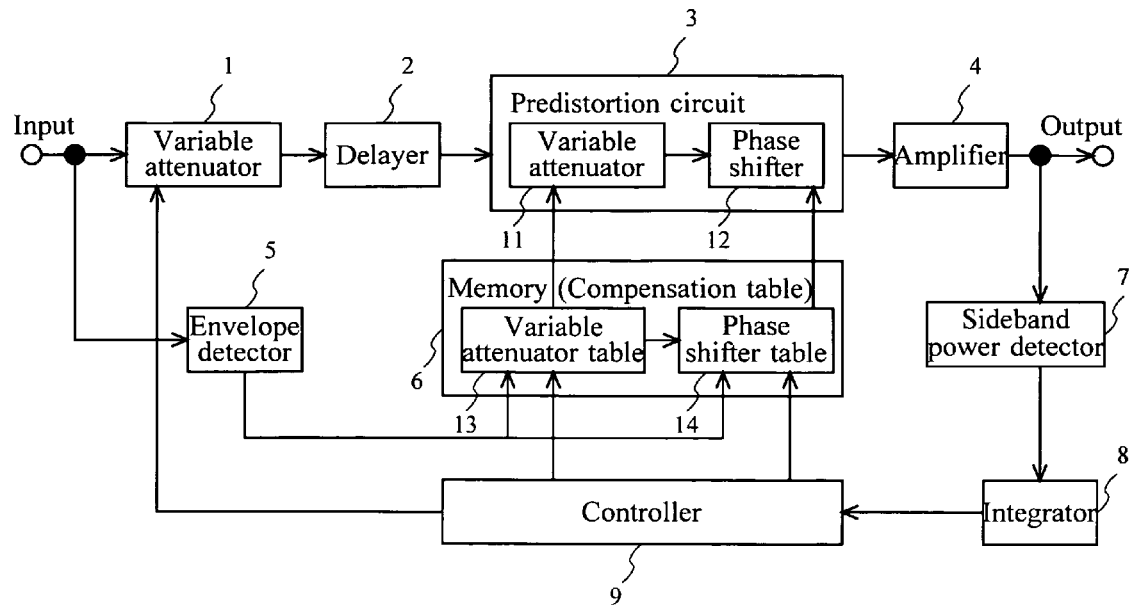
FIG. 1 is a schematic diagram showing an example of the configuration of an adaptive predistortion distortion compensation amplifier according to a first embodiment of the present invention.

FIG. 1 shows an example of the configuration of a APD distortion compensation amplifier of this embodiment.

Figure 4:
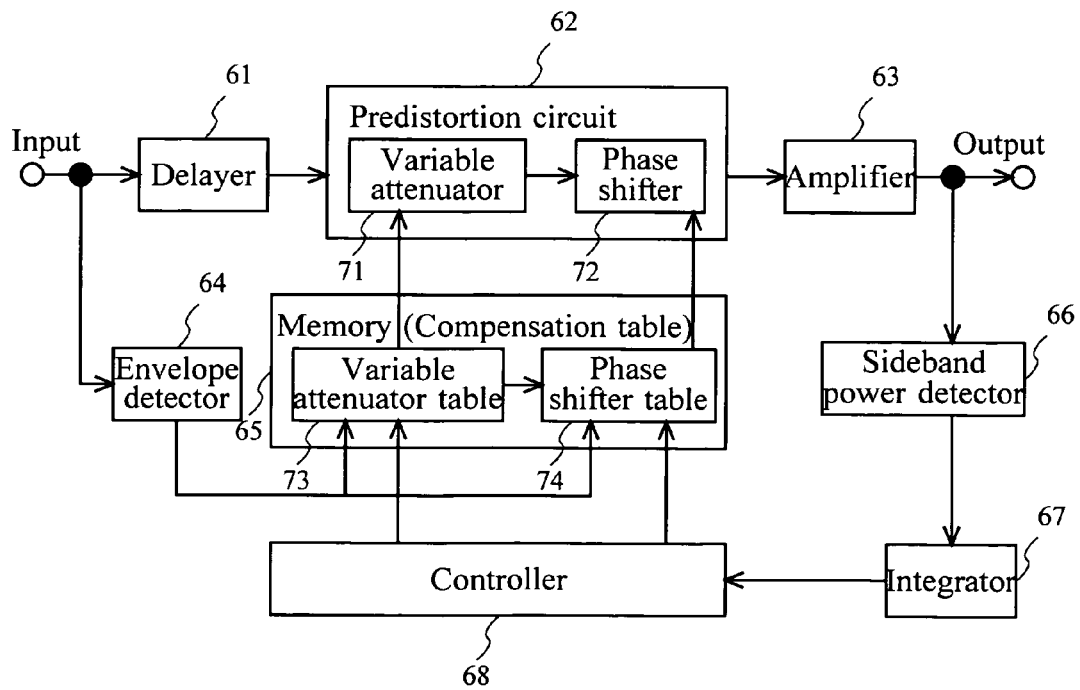
FIG. 4 is a schematic diagram showing an example of the configuration of a conventional adaptive predistortion distortion compensation amplifier.

The APD distortion compensation amplifier of this embodiment has a configuration comprising, in brief, for example, the APD distortion compensation amplifier configuration shown in FIG. 4 with the addition of a variable attenuator 1 to a stage before a delayer 2, forming a configuration that enables the variable attenuator 1 to be controlled by a controller 9.

An example of the operations performed by the APD distortion compensation amplifier of this embodiment will now be described.

A high-frequency signal input to the input terminal of the APD distortion compensation amplifier of this embodiment, is input to the variable attenuator 1 and an envelope detector 5.

The variable attenuator 1 attenuates the input signal by an attenuation amount controlled by the controller 9 described below, and outputs the attenuated signal to the delayer 2.

The delayer 2 delays the signal input from the variable attenuator 1 by a predetermined delay time and outputs it to a predistortion circuit 3.

The variable attenuator 11 of the predistortion circuit 3 attenuates the signal input from the delayer 2 by an attenuation amount that is based on a compensation data signal input from a variable attenuator table 13 described below, thereby adjusting the amplitude of the signal, and the amplitude-adjusted signal is then output to a phase shifter 12.

The phase shifter 12 of the predistortion circuit 3 changes the phase of the signal input from the variable attenuator 11 by a phase change amount (amount of phase shift) that is based on a compensation data signal input from a phase shifter table 14 described below, thereby adjusting the phase of the signal, and the phase-adjusted signal is then output to an amplifier 4.

The amplifier 4 amplifies the signal input from the phase shifter 12 of the predistortion circuit 3, and outputs the amplified signal. The output signal is output from the output terminal of the APD distortion compensation amplifier of this embodiment as a transmission output.

The envelope detector 5 detects the envelope of the input signal and the envelope information is output to the variable attenuator table 13 and the phase shifter table 14 constituting the compensation tables stored in memory 6.

The variable attenuator table 13 stores as a table the envelope information and compensation data relating to amplitude adjustment by the variable attenuator 11, and outputs to the variable attenuator 11 a compensation data signal corresponding to the envelope information input from the envelope detector 5.

The phase shifter table 14 stores as a table the envelope information and compensation data relating to phase adjustment by the phase shifter 12, and outputs to the phase shifter 12 a compensation data signal corresponding to the envelope information input from the envelope detector 5.

A portion of the signal output from the amplifier 4 is input to a sideband power detector 7, from which the sideband power detector 7 detects the sideband signal power that becomes leakage power to adjacent channels in the transmission output, and outputs the detection result to an integrator 8. In this way, in this example, control is performed by the controller 9 described below, using sideband signals as the reference.

Moreover, in this embodiment, the type of distortion detector B described in the above Patent Reference 1, for example, is used as the sideband power detector 7, which detects ACP components as sideband signal components. Various signals may be used as the sideband signals, such as first-order distortion or second-order distortion signals.

The integrator 8 performs fixed-time-period integration and outputs the integration result to the controller 9. The integrator 8 has a simple area measurement function which is a special requirement in, for example, the CDMA method.

Based on the integration result input from the integrator 8, the controller 9 updates compensation data contained in the variable attenuator table 13 stored in memory 6 and compensation data contained in the phase shifter table 14 stored in memory 6, and controls the variable attenuator 1 based on integration values input from the integrator 8.

Specifically, the controller 9 updates the stored content of the variable attenuator table 13 and the stored content of the phase shifter table 14 to decrease the integration values input from the integrator 8, that is, so the distortion components contained in the transmission signal become smaller.

The controller 9 also performs control to increase the attenuation amount of the variable attenuator 1 such as, for example, in cases in which an integration value input from the integrator 8 exceeds a preset threshold value.

As described in the above, the APD distortion compensation amplifier of this embodiment adjusts the amplitude and phase of signals input to the predistortion circuit 3 in accordance with compensation data read out from the compensation tables 13 and 14 stored in the memory 6, and uses distortion generated by these adjustments (predistortion) to cancel distortion produced by the amplifier 4.

In the APD distortion compensation amplifier of this embodiment, also, in cases in which a distortion component of distortion that is produced by the amplifier 4 and not canceled even by distortion compensation but remains after distortion compensation becomes larger than a predetermined level, to bring such a distortion component remaining after distortion compensation down to or below the predetermined level, the controller 9 controls the variable attenuator 1 to have the signal attenuated by the variable attenuator 1 to thereby reduce the output level from the APD distortion compensation amplifier, thereby making it possible to continue operating.

Consequently, with the APD distortion compensation amplifier of this embodiment, in a case in which, for example, an integration value from the integrator 8 exceeds a predetermined level and compensation for the distortion by means of the predistortion circuit 3 is not possible, the controller 9 compares the magnitude of the integration value from the integrator 8 with the predetermined level, and has the attenuation amount of the variable attenuator 1 increased until the integration value from the integrator 8 is equal to or lower than the predetermined level. Thus, with the APD distortion compensation amplifier of this example, the predistortion compensation amplifier can continue to operate without outputting the type of large distortion component that imparts an adverse effect.

Thus, with the APD distortion compensation amplifier of this embodiment, even in cases in which, in compensating to cancel the distortion produced by the amplifier 4, the predetermined compensation amount cannot be maintained, it is possible to continue operation by attenuating the signal prior to predistortion to reduce the distortion components remaining after distortion compensation to or below the predetermined level.

In this embodiment, the amplifier 4 corresponds to the amplifier that is the object of distortion compensation, and the distortion component amplitude detection means is constituted by the functions of the sideband power detector 7 and the functions of the integrator 8, and the amplified signal level reduction control means is constituted by the functions of the controller 9 and the functions of the variable attenuator 1. In this embodiment, also, the integration value of the sideband signal power level is detected as the distortion component amplitude.

In this embodiment, also, the predistortion means is constituted by the functions of the predistortion circuit 3 constituted by the variable attenuator 11 and the phase shifter 12, the functions of the envelope detector 5, and the functions of the memory 6 in which the variable attenuator table 13 and phase shifter table 14 are stored. In this embodiment, also, the signal level detection means is constituted by the functions of the envelope detector 5, and the predistortion control mode memory means is constituted by the functions of the variable attenuator table 13 and the functions of the phase shifter table 14. In this embodiment, also, the predistortion control means is constituted by the functions of the controller 9.

Next, the second embodiment will be described.

Figure 2:
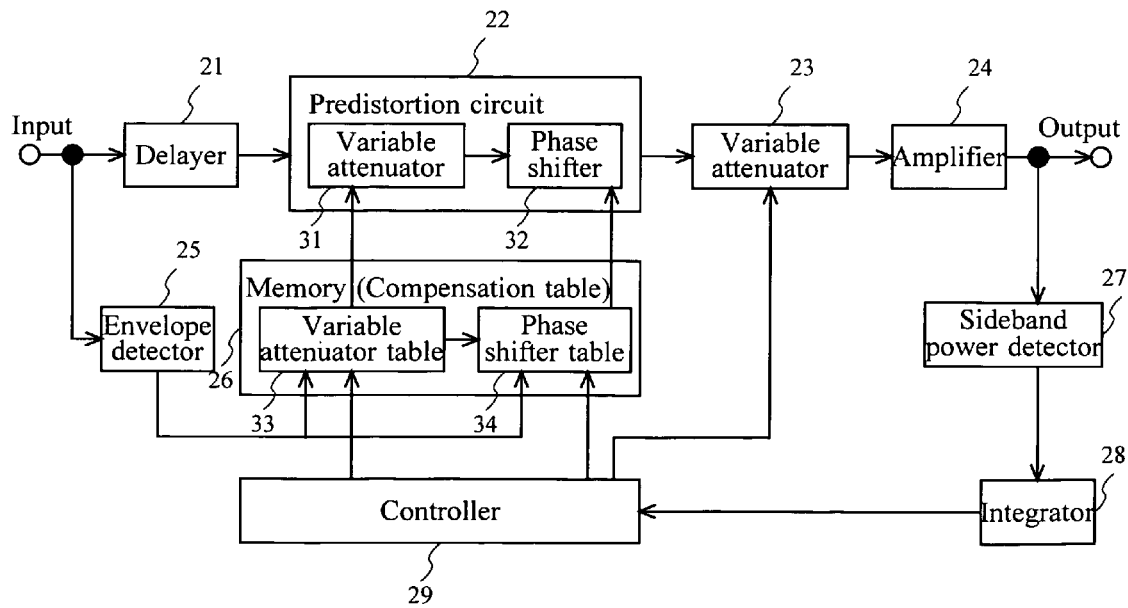
FIG. 2 is a schematic diagram showing an example of the configuration of an adaptive predistortion distortion compensation amplifier according to a second embodiment of the present invention.

FIG. 2 shows an example of the configuration of the APD distortion compensation amplifier of this embodiment.

The APD distortion compensation amplifier of this embodiment has a configuration comprising, in brief, for example, the APD distortion compensation amplifier configuration shown in FIG. 4 with the addition of a variable attenuator 23 to the stage before an amplifier 24, forming a configuration that enables the variable attenuator 23 to be controlled by a controller 29.

An example of the operations performed by the APD distortion compensation amplifier of this embodiment will now be described.

A high-frequency signal input to the input terminal of the APD distortion compensation amplifier of this embodiment, is input to a delayer 21 and an envelope detector 25.

The delayer 21 delays the input signal by a predetermined delay time and outputs it to a predistortion circuit 22.

In the predistortion circuit 22, similarly, for example, to the predistortion circuit 3 shown in FIG. 1, the amplitude and phase of the signal input from the delayer 21 are adjusted by a variable attenuator 31 and a phase shifter 32, and the signal thus adjusted is output to the variable attenuator 23.

The variable attenuator 23 attenuates the signal input from the predistortion circuit 22 by an attenuation amount that is controlled by the controller 29 described below, and the attenuated signal is output to the amplifier 24.

The amplifier 24 amplifies the signal input from the variable attenuator 23 and outputs the amplified signal. The output signal is output from the output terminal of the APD distortion compensation amplifier of this embodiment as a transmission output.

Similarly to the envelope detector 5, variable attenuator table 13 and phase shifter table 14 shown in FIG. 1, for example, with the envelope detector 25, the variable attenuator table 33 stored in memory 26 and phase shifter table 34, the envelope of the input signal is detected, an amplitude compensation data signal corresponding to the envelope information is output to the variable attenuator 31 and a phase compensation data signal corresponding to the envelope information is output to the phase shifter 32.

Similarly to the sideband power detector 7 and integrator 8 shown in FIG. 1, for example, a sideband power detector 27 and an integrator 28 use a portion of the signal output from the amplifier 4 to integrate detected power values of sideband signals and output the integration result to the controller 29.

Similarly to the controller 9 shown in FIG. 1, based on the integration values input from the integrator 28, the controller 29 updates compensation data contained in the variable attenuator table 33 and compensation data contained in the phase shifter table 34. The controller 29 also controls the variable attenuator 23 based on integration values input from the integrator 28.

As in the above, in the APD distortion compensation amplifier of this embodiment, also, in cases in which a distortion component of distortion that is produced by the amplifier 24 and not canceled even by distortion compensation but remains after distortion compensation becomes larger than a predetermined level, to bring such a distortion component remaining after distortion compensation down to or below the predetermined level, the controller 29 controls the variable attenuator 23 to have the signal attenuated by the variable attenuator 23 to thereby reduce the output level from the APD distortion compensation amplifier, thereby making it possible to continue operating.

Consequently, with the APD distortion compensation amplifier of this embodiment, in a case in which, for example, an integration value from the integrator 28 exceeds a predetermined level and compensation for the distortion by means of the predistortion circuit 22 is not possible, the controller 29 compares the magnitude of the integration value from the integrator 28 with the predetermined level, and has the attenuation amount of the variable attenuator 23 increased until the integration value from the integrator 28 is equal to or lower than the predetermined level. Thus, with the APD distortion compensation amplifier of this example, the predistortion compensation amplifier can continue to operate without outputting the type of large distortion component that imparts an adverse effect.

Thus, with the APD distortion compensation amplifier of this embodiment, even in cases in which, in compensating to cancel the distortion produced by the amplifier 24, the predetermined compensation amount cannot be maintained, it is possible to continue operation by attenuating the signal prior to predistortion to reduce the distortion components remaining after distortion compensation to or below the predetermined level.

Next, the third embodiment will be described.

Figure 3:
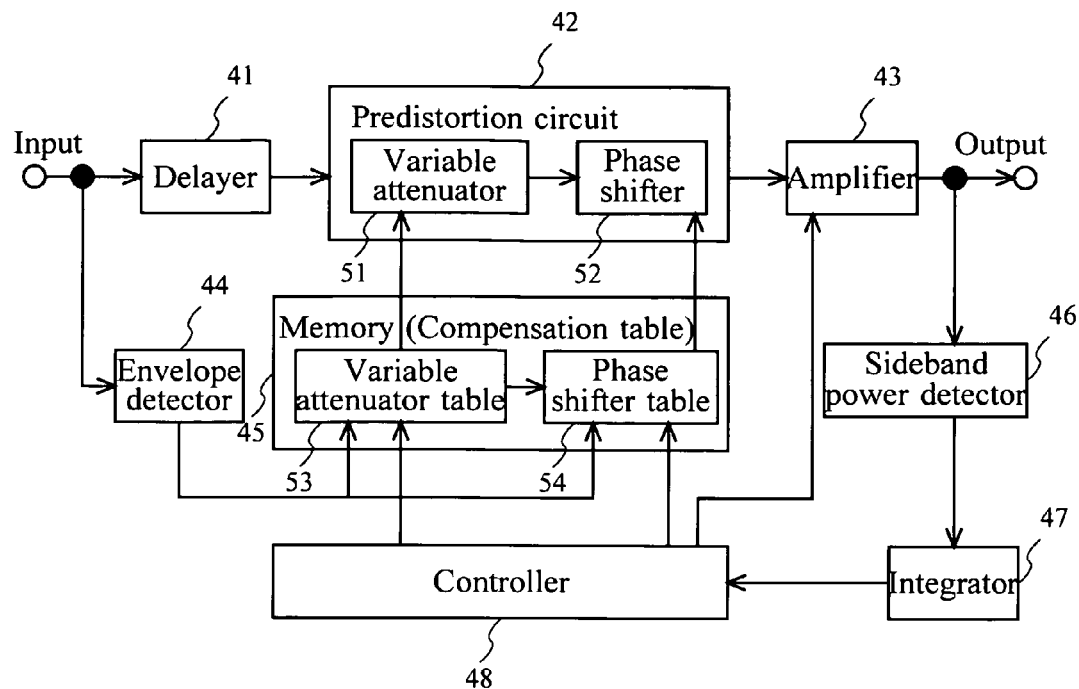
FIG. 3 is a schematic diagram showing an example of the configuration of an adaptive predistortion distortion compensation amplifier according to a third embodiment of the present invention.

FIG. 3 shows an example of the configuration of the APD distortion compensation amplifier of this embodiment.

The APD distortion compensation amplifier of this embodiment has a configuration comprising, in brief, for example, the APD distortion compensation amplifier configuration shown in FIG. 4 in which an amplifier 43 can be controlled by a controller 48. As the amplifier 43, this embodiment uses, for example, a variable-gain amplifier in which the gain (amplification factor) can be variably controlled.

An example of the operations performed by the APD distortion compensation amplifier of this embodiment will now be described.

A high-frequency signal input to the input terminal of the APD distortion compensation amplifier of this embodiment, is input to a delayer 41 and an envelope detector 44.

The delayer 41 delays the input signal by a predetermined delay time and outputs it to a predistortion circuit 42.

In the predistortion circuit 42, similarly, for example, to the predistortion circuit 3 shown in FIG. 1, the amplitude and phase of the signal input from the delayer 41 are adjusted by a variable attenuator 51 and a phase shifter 52, and the signal thus adjusted is output to the amplifier 43.

The amplifier 43 amplifies the signal input from the predistortion circuit 42 at a gain controlled by the controller 48 described below, and outputs the amplified signal. The output signal is output from the output terminal of the APD distortion compensation amplifier of this embodiment as a transmission output.

Similarly to the envelope detector 5, variable attenuator table 13 and phase shifter table 14 shown in FIG. 1, for example, with the envelope detector 44 and memory 45 in which variable attenuator table 53 and phase shifter table 54 are stored, the envelope of the input signal is detected, an amplitude compensation data signal corresponding to the envelope information is output to the variable attenuator 51 and a phase compensation data signal corresponding to the envelope information is output to the phase shifter 52.

Similarly to the sideband power detector 7 and integrator 8 shown in FIG. 1, for example, a sideband power detector 46 and an integrator 47 use a portion of the signal output from the amplifier 43 to integrate detected power values of sideband signals and output the integration result to the controller 48.

Similarly to the controller 9 shown in FIG. 1, based on the integration values input from the integrator 47, the controller 48 updates compensation data contained in the variable attenuator table 53 and compensation data contained in the phase shifter table 54.

The controller 48 also controls the amplifier 43 based on integration values input from the integrator 47. Specifically, for example in cases in which in which an integration value input from the integrator 43 exceeds a preset threshold value, the controller 48 performs control to reduce the gain of the amplifier 43.

As in the above, in the APD distortion compensation amplifier of this embodiment, also, in cases in which a distortion component of distortion that is produced by the amplifier 43 and not canceled even by distortion compensation but remains after distortion compensation becomes larger than a predetermined level, to bring such a distortion component remaining after distortion compensation down to or below the predetermined level, the controller 48 controls the amplifier 43 to reduce the signal amplification gain of the amplifier 43 to thereby reduce the output level from the APD distortion compensation amplifier, whereby operation continues.

Consequently, with the APD distortion compensation amplifier of this embodiment, in a case in which, for example, an integration value from the integrator 47 exceeds a predetermined level and compensation for the distortion by means of the predistortion circuit 42 is not possible, the controller 48 compares the magnitude of the integration value from the integrator 47 with the predetermined level, and reduces the gain of the amplifier 43 until the integration value from the integrator 47 is equal to or lower than the predetermined level. Thus, with the APD distortion compensation amplifier of this example, the predistortion compensation amplifier can continue to operate without outputting the type of large distortion component that imparts an adverse effect.

Thus, with the APD distortion compensation amplifier of this embodiment, even in cases in which, in compensating to cancel the distortion produced by the amplifier 43, the predetermined compensation amount cannot be maintained, it is possible to continue operation by reducing the gain of the amplifier 43 to reduce the distortion components remaining after distortion compensation to or below the predetermined level.

The above-described first embodiment showed an example of a configuration in which variable attenuator 1 was provided in the stage before the delayer 2 and the above-described second embodiment showed an example of a configuration in which variable attenuator 23 was provided between the predistortion circuit 22 and the amplifier 24, but it is also possible to use a configuration in which the variable attenuator is provided in another location. For example, it is also possible to use a configuration in which the variable attenuator is provided between the variable attenuator and the delayer.

The configuration of the amplifier apparatus and the like according to the present invention is not limited to those shown in the foregoing, and any of various other configurations may be used. Moreover, the present invention can for example be provided as a program or the like for executing methods or modes of processing according to the present invention, or for realizing such methods or modes.

Furthermore, the field of application of the present invention is not limited to that set out in the foregoing, the present invention being also applicable to various fields.

Furthermore, for the various types of processing performed in the amplifier apparatus or the like according to the present invention, a control configuration may be used in which a processor in hardware resources provided with a processor and memory and the like, for example, executes a control program stored in ROM (Read Only Memory), or the various functional means for executing this processing may also be constituted independent hardware circuits.

Furthermore, the present invention may also be understood as the aforementioned program (itself) or as a Floppy Disk, CD (Compact Disc)-ROM or other computer-readable recording media in which the program is stored, so that the processing according to the present invention can be implemented by the control program being input from the recording medium into a computer and executed by a processor.

INDUSTRIAL APPLICABILITY

As described in the foregoing, in accordance with the amplifier apparatus according to the present invention, when compensating for distortion produced by an amplifier that amplifies a signal, the amplitude of the distortion component produced by the amplifier that is contained in the signal amplified by the amplifier after distortion compensation is detected, and in a case in which the amplitude of the detected distortion component exceeds a predetermined threshold value, control is performed to reduce the level of the signal amplified by the amplifier, so that even in cases in which the amplitude of the distortion component contained in the amplified signal after distortion compensation becomes large, the level of distortion contained in the amplified signal after distortion compensation can be reduced, making it possible for the amplifier apparatus to continue operating.

The invention claimed is:

1. An amplifier apparatus in which a signal is amplified by an amplifier and distortion produced by the amplifier is compensated for, the amplifier apparatus comprising:
    distortion component amplitude detection means that detects an amplitude of a distortion component produced by the amplifier contained in a signal amplified by the amplifier after distortion compensation; and
    amplified signal level reduction control means that, in a case in which the amplitude of the distortion component detected by the distortion component amplitude detection means exceeds a predetermined threshold value, performs control to reduce a level of the signal amplified by the amplifier,
    wherein the amplified signal level reduction control means performs control to reduce the level of the signal amplified by the amplifier by performing control to change the gain of the amplifier, the amplifier being a variable-gain amplifier.

2. An amplifier apparatus in which a signal is amplified by an amplifier and distortion produced by the amplifier is compensated for, the amplifier apparatus comprising:
    distortion component amplitude detection means that detects an amplitude of a distortion component produced by the amplifier contained in a signal amplified by the amplifier after distortion compensation; and
    amplified signal level reduction control means that, in a case in which the amplitude of the distortion component detected by the distortion component amplitude detection means exceeds a predetermined threshold value, performs control to reduce a level of the signal amplified by the amplifier, wherein the amplified signal level reduction control means performs control to reduce the level of the signal amplified by the amplifier by performing control to have the signal attenuated prior to amplification by a variable attenuator provided in a stage before the amplifier, wherein the amplifier apparatus further comprises a delayer, a predistortion circuit, an envelope detector, and a compensation table, wherein the distortion component amplitude detection means includes a sideband power detector and an integrator, wherein the amplified signal level reduction control means includes the variable attenuator and a controller, wherein an input signal that is an object of amplification is input to the variable attenuator and the envelope detector, wherein the variable attenuator attenuates the input signal by an attenuation amount controlled by the controller, and outputs the attenuated signal to the delayer, wherein the delayer delays the signal input from the variable attenuator by a predetermined delay time and outputs it to the predistortion circuit, wherein the predistortion circuit adjusts an amplitude of the signal input from the delayer by attenuating the signal by an attenuation amount that is based on a compensation data signal relating to amplitude adjustment input from the compensation table, and adjusts a phase of the signal by a phase change amount that is based on a compensation data signal relating to phase compensation input from the compensation table, and outputs the amplitude-and-phase-adjusted signal to the amplifier, wherein the amplifier amplifies the signal input from the predistortion circuit and outputs the amplified signal, wherein the envelope detector detects the envelope of the input signal and outputs envelope information to the compensation table, wherein the compensation table contains correspondences between the envelope information and compensation data relating to amplitude adjustment by the predistortion circuit, and also contains correspondences between the envelope information and compensation data relating to phase adjustment by the predistortion circuit, and outputs to the predistortion circuit the compensation data signal relating to amplitude adjustment and the compensation data signal relating to phase adjustment corresponding to the envelope information input from the envelope detector, wherein the sideband power detector detects, from input of a portion of the signal output from the amplifier, sideband signal power that becomes leakage power to adjacent channels in a transmission output, and outputs the detection result to the integrator, wherein the integrator performs fixed-time-period integration of the detection result input from the sideband power detector and outputs the integration result to the controller, and wherein based on the integration result input from the integrator, the controller updates compensation data relating to amplitude adjustment and compensation data relating to phase adjustment contained in the compensation table to decrease an integration value input from the integrator, and also performs control to increase the attenuation amount of the variable attenuator in a case in which the integration value input from the integrator exceeds a preset threshold value.

3. An amplifier apparatus in which a signal is amplified by an amplifier and distortion produced by the amplifier is compensated for, the amplifier apparatus comprising:

distortion component amplitude detection means that detects an amplitude of a distortion component produced by the amplifier contained in a signal amplified by the amplifier after distortion compensation; and amplified signal level reduction control means that, in a case in which the amplitude of the distortion component detected by the distortion component amplitude detection means exceeds a predetermined threshold value, preforms control to reduce a level of the signal amplified by the amplifier, wherein the amplified signal level reduction control means performs control to reduce the level of the signal amplified by the amplifier by performing control to have the signal attenuated after amplification by a variable attenuator provided in a stage after the amplifier, wherein the amplifier apparatus further comprises a delayer, a predistortion circuit, an envelope detector, and a compensation table, wherein the distortion component amplitude detection means includes a sideband power detector and an integrator, wherein the amplified signal level reduction control means includes the variable attenuator and a controller, wherein an input signal that is an object of amplification is input to the delayer and the envelope detector, wherein the delayer delays the input signal by a predetermined delay time and outputs it to the predistortion circuit, wherein the predistortion circuit adjusts an amplitude of the signal input from the delayer by attenuating the signal by an attenuation amount that is based on a compensation data signal relating to amplitude adjustment input from the compensation table, and adjusts a phase of the signal by a phase change amount that is based on a compensation data signal relating to phase compensation input from the compensation table, and outputs the amplitude-and-phase-adjusted signal to the variable attenuator, wherein the variable attenuator attenuates the signal input from the predistortion circuit by an attenuation amount controlled by the controller, and outputs the attenuated signal to the amplifier, wherein the amplifier amplifies the signal input from the variable attenuator and outputs the amplified signal, wherein the envelope detector detects the envelope of the input signal and outputs envelope information to the compensation table, wherein the compensation table contains correspondences between the envelope information and compensation data relating to amplitude adjustment by the predistortion circuit, and also contains correspondences between the envelope information and compensation data relating to phase adjustment by the predistortion circuit, and outputs to the predistortion circuit the compensation data signal relating to amplitude adjustment and the compensation data signal relating to phase adjustment corresponding to the envelope information input from the envelope detector, wherein the sideband power detector detects, from input of a portion of the signal output from the amplifier, sideband signal power that becomes leakage power to adjacent channels in the transmission output, and outputs the detection result to the integrator, wherein the integrator performs fixed-time-period integration of the detection result input from the sideband power detector and outputs the integration result to the controller, and wherein based on the integration result input from the integrator, the controller updates compensation data relating to amplitude adjustment and compensation data relating to phase adjustment contained in the compensation table to decrease an integration value input from the integrator, and also performs control to increase the attenuation amount of the variable attenuator in a case in which the integration value input from the integrator exceeds a preset threshold value.

4. An amplifier apparatus according to claim 1, further comprising a delayer, a predistortion circuit, an envelope detector, and a compensation table, wherein the distortion component amplitude detection means includes a sideband power detector arid an integrator, wherein the amplified signal level reduction control means includes a controller, wherein an input signal that is an object of amplification is input to the delayer and the envelope detector, wherein the delayer delays the input signal by a predetermined delay time and outputs it to the predistortion circuit, wherein the predistortion circuit adjusts an amplitude of the signal input from the delayer by attenuating the signal by an attenuation amount that is based on a compensation data signal relating to amplitude adjustment input from the compensation table, and adjusts a phase of the signal by a phase change amount that is based on a compensation data signal relating to phase compensation input from the compensation table, and outputs the amplitude-and-phase-adjusted signal to the amplifier, wherein the amplifier amplifies the signal input from the predistortion circuit at a gain controlled by the controller and outputs the amplified signal, wherein the envelope detector detects the envelope of the input signal and outputs envelope information to the compensation table, wherein the compensation table contains correspondences between the envelope information and compensation data relating to amplitude adjustment by the predistortion circuit, and also contains correspondences between the envelope information and compensation data relating to phase adjustment by the predistortion circuit, and outputs to the predistortion circuit the compensation data signal relating to amplitude adjustment and the compensation data signal relating to phase adjustment corresponding to the envelope information input from the envelope detector, wherein the sideband power detector detects, from input of a portion of the signal output from the amplifier, sideband signal power that becomes leakage power to adjacent channels in a transmission output, and outputs the detection result to the integrator, wherein the integrator performs fixed-time-period integration of the detection result input from the sideband power detector and outputs the integration result to the controller, and wherein based on the integration result input from the integrator, the controller updates compensation data relating to amplitude adjustment and compensation data relating to phase adjustment contained in the compensation table to decrease an integration value input from the integrator, and based on the integration value input from the integrator, also controls the amplifier to reduce the amplifier gain in a case in which the integration value input from the integrator exceeds a preset threshold value.

5. An amplifier apparatus in which a signal is amplified by an amplifier and distortion produced by the amplifier is compensated for, the amplifier apparatus comprising:

distortion component amplitude detection means that detects an amplitude of a distortion component produced by the amplifier contained in a signal amplified by the amplifier after distortion compensation;

amplified signal level reduction control means that, in a case in which the amplitude of the distortion component detectable the distortion component amplitude detection means exceeds a predetermined threshold value, performs control to reduce a level of the signal amplified by the amplifier; and compensating means for compensating for distortion produced by the amplifier, the compensating means including a predistortion means that generates distortion with respect to a signal prior to amplification by the amplifier, and predistortion control means that controls the distortion generated by the predistortion means based on the amplitude of the distortion component detected by the distortion component amplitude detection means, wherein the amplified signal level reduction control means performs control to reduce the level of the signal amplified by the amplifier by performing control to change a gain of the amplifier, the amplifier being a variable-gain amplifier.

* * * * *